United States Patent [19]
Yamamoto et al.

[11] Patent Number: 5,392,013
[45] Date of Patent: Feb. 21, 1995

[54] SURFACE ACOUSTIC WAVE FILTER CAPABLE OF WIDENING A BANDWIDTH

[75] Inventors: Yasushi Yamamoto; Ryuuji Kajihara, both of Tokyo, Japan

[73] Assignee: Nec Corporation, Tokyo, Japan

[21] Appl. No.: 92,752

[22] Filed: Jul. 16, 1993

[30] Foreign Application Priority Data

Jul. 17, 1992 [JP] Japan .................... 4-190552

[51] Int. Cl.$^6$ ............................. H03H 9/63
[52] U.S. Cl. .................... 333/195; 333/194; 310/313 B
[58] Field of Search .................... 333/193–196; 310/313 R, 313 B, 313 C, 313 D

[56] References Cited

U.S. PATENT DOCUMENTS

| | | | |
|---|---|---|---|
| 4,151,492 | 4/1979 | Sandy et al. | 333/193 |
| 4,162,466 | 7/1979 | Hunsinger et al. | 333/195 |
| 4,387,355 | 6/1983 | Uno et al. | 333/195 |

FOREIGN PATENT DOCUMENTS

| | | | |
|---|---|---|---|
| 0012206 | 1/1987 | Japan | 333/195 |
| 0194406 | 8/1988 | Japan | 333/195 |
| 0283309 | 11/1988 | Japan | 333/195 |
| 0019815 | 1/1989 | Japan | 333/195 |
| 4113711 | 4/1992 | Japan | 333/193 |

*Primary Examiner*—Robert J. Pascal
*Assistant Examiner*—Darios Gambino

[57] ABSTRACT

In a surface acoustic wave filter utilizing at least two longitudinal modes, input and output interdigital transducers are mounted on a piezoelectric substrate so as to oppose each other. First and second grating reflectors are mounted on the piezoelectric substrate outside the input and the output interdigital transducers, respectively. Each of the input and the output interdigital transducers comprises a plurality of electrode digits which are equal to N in number. Each of the electrode digits is made of a metal material having a discontinuous impedance coefficient K related to acoustic impedance. The surface acoustic wave filter is structured so that a product of the number N and the discontinuous impedance coefficient K is not smaller than 0.55.

2 Claims, 5 Drawing Sheets

SURFACE ACOUSTIC WAVE FILTER CAPABLE OF WIDENING A BANDWIDTH

BACKGROUND OF THE INVENTION

This invention relates to a surface acoustic wave filter utilizing at least two longitudinal modes which are different from each other and which are excited in the same direction as a propagation direction of a surface wave.

As an example of a surface acoustic wave filter, a surface acoustic wave filter of a longitudinal mode resonator type is disclosed in an article which is contributed by MASAKI TANAKA et al to Fifteenth EM Symposium, Mar. 12, 1986, pages 5–9, and which has a title of "Narrow Bandpass Double Mode SAW Filter". Such a surface acoustic wave filter comprises a piezoelectric substrate, input and output interdigital transducers which are mounted on the piezoelectric substrate such that the output interdigital transducer is located opposite to the input interdigital transducer, and first and second grating reflectors which are mounted on the piezoelectric substrate. The first grating reflector opposes the input interdigital transducer at an opposite side of the output interdigital transducer. The second grating reflector opposes the output interdigital transducer at an opposite side of the input interdigital transducer.

The input interdigital transducer comprises a plurality of input electrode digits which intersect one another. The input interdigital transducer converts an input electric signal into an input surface acoustic wave as a propagated surface acoustic wave. Similarly, the output interdigital transducer comprises a plurality of output electrode digits which intersect one another. The output interdigital transducer receives the propagated surface acoustic wave as a received surface acoustic wave and converts the received surface acoustic wave into an output electric signal.

In such a surface acoustic wave filter, a surface wave excited by the input and the output electrode digits is confined between the first and the second grating reflectors. At this time, a cavity having a predetermined length is formed between the first and the second grating reflectors and the cavity causes a standing wave. Generally, the surface acoustic wave filter utilizes a basic or fundamental mode together with a primary or a secondary mode of the standing wave. Such a surface acoustic wave filter is called a surface acoustic wave filter of a double mode type. The basic, the primary, and the secondary modes have basic, primary, and secondary resonance frequencies, respectively. The primary mode, the secondary mode, and the like are collectively called a higher-order mode. As well known in the art, a resonance frequency of the standing wave is determined by the predetermined length of the cavity. A bandwidth of the surface acoustic wave filter is determined by a frequency interval between the basic resonance frequency and the primary or the secondary resonance frequency.

In order to widen the bandwidth of the surface acoustic wave filter, it is necessary to reduce the number of the electrode digits of the input and the output interdigital transducers. There is, however, a restriction on widening the bandwidth of the surface acoustic wave filter caused by an increase in insertion loss. In other words, the surface acoustic wave filter of a double mode type has problems of increased impedance and degraded out of band attenuation resulting from widening the bandwidth.

SUMMARY OF THE INVENTION

It is therefore an object of this invention to provide a surface acoustic wave filter which is capable of widening a bandwidth.

Other objects of this invention will become clear as the description proceeds.

In describing the gist of this invention, it should be understood that a surface acoustic wave filter utilizes at least two longitudinal modes which are different from each other and comprises a piezoelectric substrate, an input interdigital transducer supplied with an input electric signal and mounted on the piezoelectric substrate for converting the input electric signal into an input surface acoustic wave as a surface acoustic wave propagated thereon. The input interdigital transducer comprises a plurality of input electrode digits which are equal to N in number where N represents a positive integer greater than two and which intersect one another. The surface acoustic wave filter further comprises an output interdigital transducer mounted on the piezoelectric substrate and located opposite the input interdigital transducer and comprises a plurality of output electrode digits which are equal to N in number and which intersect one another. The output interdigital transducer receives the propagated surface acoustic wave as a received surface acoustic wave and converts the received surface acoustic wave into an output electric signal. The surface acoustic wave filter still further comprises a first grating reflector mounted on the piezoelectric substrate and located opposite to the input interdigital transducer at an opposite side of the output interdigital transducer and a second grating reflector mounted on the piezoelectric substrate and located opposite the output interdigital transducer at an opposite side of the input interdigital transducer. Each of the input and the output electrode digits is made of metal material having a discontinuous impedance coefficient K related to acoustic impedance. The filter is structured so that a product of the number N and the discontinuous impedance coefficient K is not smaller than 0.55.

DESCRIPTION OF THE PREFERRED EMBODIMENT

Figure 1:
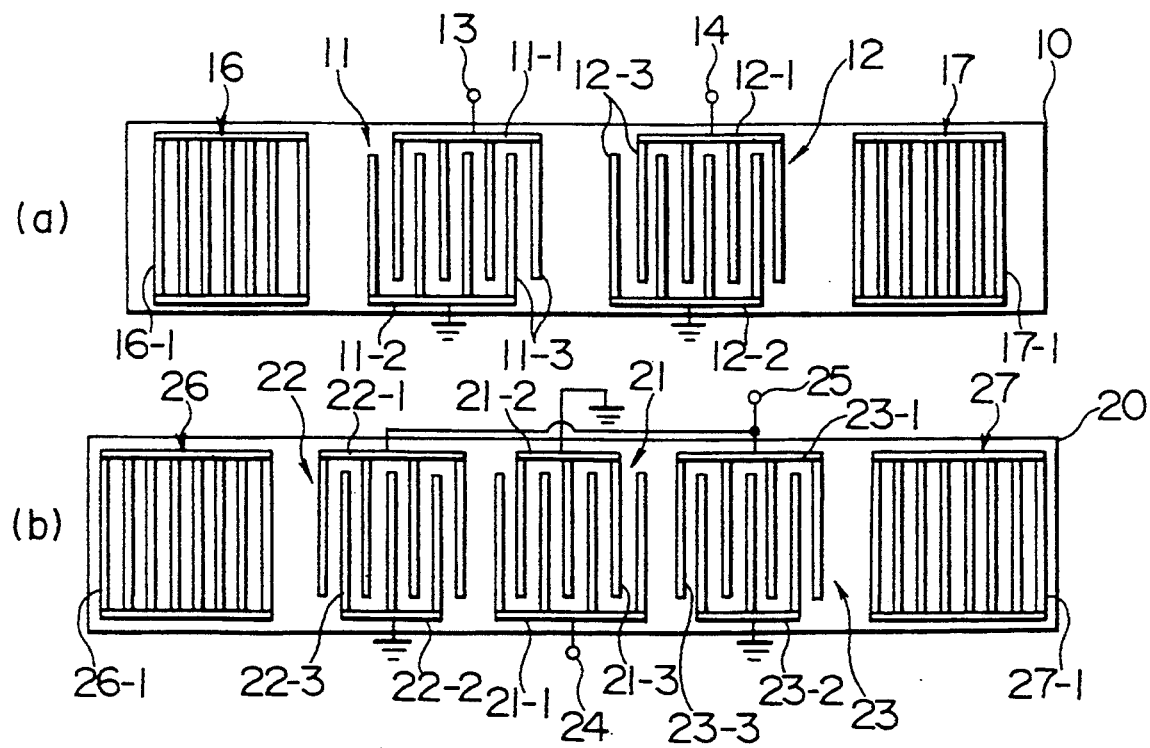
FIG. 1 shows conventional surface acoustic wave filters.

Referring to FIG. 1, two types of conventional surface acoustic wave filters will be described in order to facilitate an understanding of this invention.

In FIG. 1(a), the surface acoustic wave filter is of the type which is disclosed in a reference cited before, namely, "Narrow Bandpass Double Mode SAW Filter", and utilizes a basic mode and a primary mode of a standing wave. The surface acoustic wave filter comprises a piezoelectric substrate 10 which is formed by an ST cut crystal substrate. On the piezoelectric substrate 10, input and output interdigital transducers 11 and 12 are mounted so that the output interdigital transducer is 12 located opposite to the input interdigital transducer 11. First and second grating reflectors 16 and 17 are mounted on the piezoelectric substrate 10 so that the first grating reflector 16 opposes the input interdigital transducers 11 at an opposite side of the output interdigital transducer 12 and that the second grating reflector 17 opposes the output interdigital transducer 12 at an opposite side of the input interdigital transducer 11.

The input interdigital transducer 11 has an input electrode pattern comprising an input electrode 11-1 connected to an input terminal 13 and an input earth electrode 11-2 which is grounded or earthed. Between the input electrode 11-1 and the input earth electrode 11-2, a plurality of input electrode digits 11-3 are disposed in parallel along a predetermined direction so that the input electrode digits 11-3 intersect one another. Each of the electrode digits 11-3 has a uniform length. The input interdigital transducer 11 is supplied with an input electric signal through the input terminal 13 and converts the input electric signal into an input surface acoustic wave (SAW). The input surface acoustic wave is propagated on a surface of the piezoelectric substrate 10 as a propagated surface acoustic wave along the predetermined direction.

The output interdigital transducer 12 has an output electrode pattern which is similar to the input electrode pattern of the input interdigital transducer 11. Namely, the output electrode pattern comprises an output electrode 12-1 connected to an output terminal 14, an output earth electrode 12-2 which is grounded or earthed, and a plurality of output electrode digits 12-3 which are disposed in parallel along the predetermined direction so that the electrode digits 12-3 intersect one another.

The propagated surface acoustic wave is received by the output interdigital transducer 12 as a received surface acoustic wave. The output interdigital transducer 12 converts the received surface acoustic wave into an output electric signal. The output interdigital transducer 12 outputs the output electric signal through the output terminal 14.

The first and the second grating reflectors 16 and 17 are for confining a surface wave excited by the input and the output electrode digits in order to generate a standing wave in a cavity formed between the first and the second grating reflectors 16 and 17. For this purpose, the first grating reflector 16 comprises a plurality of reflector electrodes 16-1 which are disposed in parallel and which are electrically connected in parallel. Similarly, the second grating reflector 17 comprises a plurality of reflector electrodes 17-1 which are disposed in parallel and which are electrically connected in parallel.

In FIG. 1(b), the surface acoustic wave filter is of the type disclosed in an article which is contributed by TADASHI KANDA et al to THE TRANSACTIONS OF THE INSTITUTE OF ELECTRONICS, INFORMATION AND COMMUNICATION ENGINEERS, 1988, page 1-240, and which has a title of "A Method for Widening the Bandwidth of SAW Resonator Filter by Utilizing Longitudinal Inharmonic Modes". The surface acoustic wave filter utilizes the basic mode and a secondary mode of the standing wave and comprises a piezoelectric substrate 20, an input interdigital transducer 21 mounted on the piezoelectric substrate 20, and first and second output interdigital transducers 22 and 23 which are mounted on the piezoelectric substrate 20 on both sides of the input interdigital transducer 21. First and second grating reflectors 26 and 27 are mounted on the piezoelectric substrate 20 so that the first grating reflector 26 opposes the first output interdigital transducer 22 at an opposite side of the input interdigital transducer 21 and that the second grating reflector 27 opposes the second output interdigital transducer 23 at an opposite side of the input interdigital transducer 21.

The input interdigital transducer 21 has an input electrode pattern comprising an input electrode 21-1 connected to an input terminal 24 and an input earth electrode 21-2 which is grounded. Between the input electrode 21-1 and the input earth electrode 21-2, a plurality of input electrode digits 21-3 are disposed in parallel along a predetermined direction with the input electrode digits 21-3 inter-secting one another. The input interdigital transducer 21 is for converting an input electric signal supplied through the input terminal 24 into an input surface acoustic wave. The input surface acoustic wave is propagated on the surface of the piezoelectric substrate 20 as a propagated surface acoustic wave.

Each of the first and the second output interdigital transducers 22 and 23 has an output electrode pattern which is similar to the input electrode pattern of the input interdigital transducer 21. With regard to the first output interdigital transducer 22, the output electrode pattern comprises a first output electrode 22-1, a first output earth electrode 22-2 which is grounded, and a plurality of first output electrode digits 22-3 which are disposed in parallel along the predetermined direction with the first output electrode digits 22-3 inter-secting one another. Similarly, the output electrode pattern of the second output interdigital transducer 23 comprises a second output electrode 23-1, a second output earth electrode 23-2 which is grounded, and a plurality of second output electrode digits 23-2 which are disposed in parallel along the predetermined direction with the second output electrode digits 23-3 inter-secting one another. The first and the second output electrodes 22-1 and 23-1 are commonly connected to an output terminal 25.

Like the first and the second grating reflectors 16 and 17, the first grating reflector 26 comprises a plurality of reflector electrodes 26-1 which are disposed in parallel and which are electrically connected in parallel while the second grating reflector 27 comprises a plurality of reflector electrodes 27-1 which are similar to the reflector electrodes 26-1.

The propagated surface acoustic wave is received by the first and the second output interdigital transducers 22 and 23 as first and second received surface acoustic waves. Each of the first and the second output interdigital transducers 22 and 23 converts the first and the second received surface acoustic waves into first and second output electric signals. The surface acoustic wave filter outputs an output electric signal through the output terminal 25.

In the surface acoustic wave filter illustrated in FIG. 1(a), the surface wave excited by the input and the output electrode digits is confined between the first and the second grating reflectors 16 and 17. At this time, the cavity having a predetermined length is formed between the first and the second grating reflectors 16 and 17 and the cavity causes the standing wave. The basic, the primary, and the secondary modes have basic, primary, and secondary resonance frequencies, respectively. As well known in the art, a resonance frequency of the standing wave is determined by the predetermined length of the cavity. A bandwidth of the surface acoustic wave filter is determined by a frequency interval between the basic resonance frequency and the primary or the secondary resonance frequency.

In order to widen the bandwidth of the surface acoustic wave filter, it is necessary to reduce the number of the electrode digits of the input and the output interdigital transducers. There is, however, a restriction on widening the bandwidth of the surface acoustic wave filter caused by an increase in insertion loss. In other words, the double mode type surface acoustic wave filter has problems of increased impendance and degraded out of band attenuation resulting from widening the bandwidth. These problems apply to the surface acoustic wave filter illustrated in FIG. 1(b).

Figure 2:
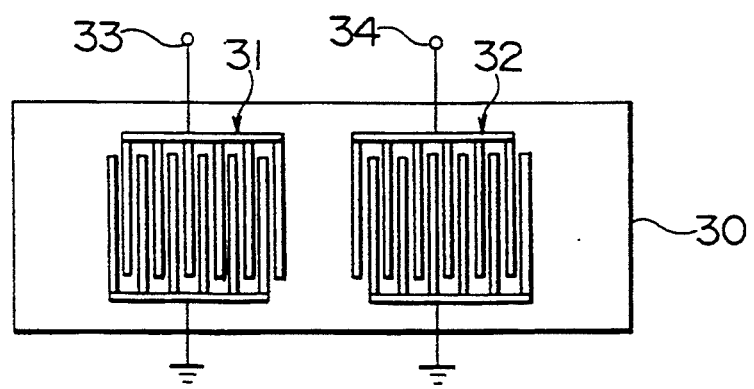
FIG. 2 shows a conventional surface acoustic wave filter of another type.
Figure 3:
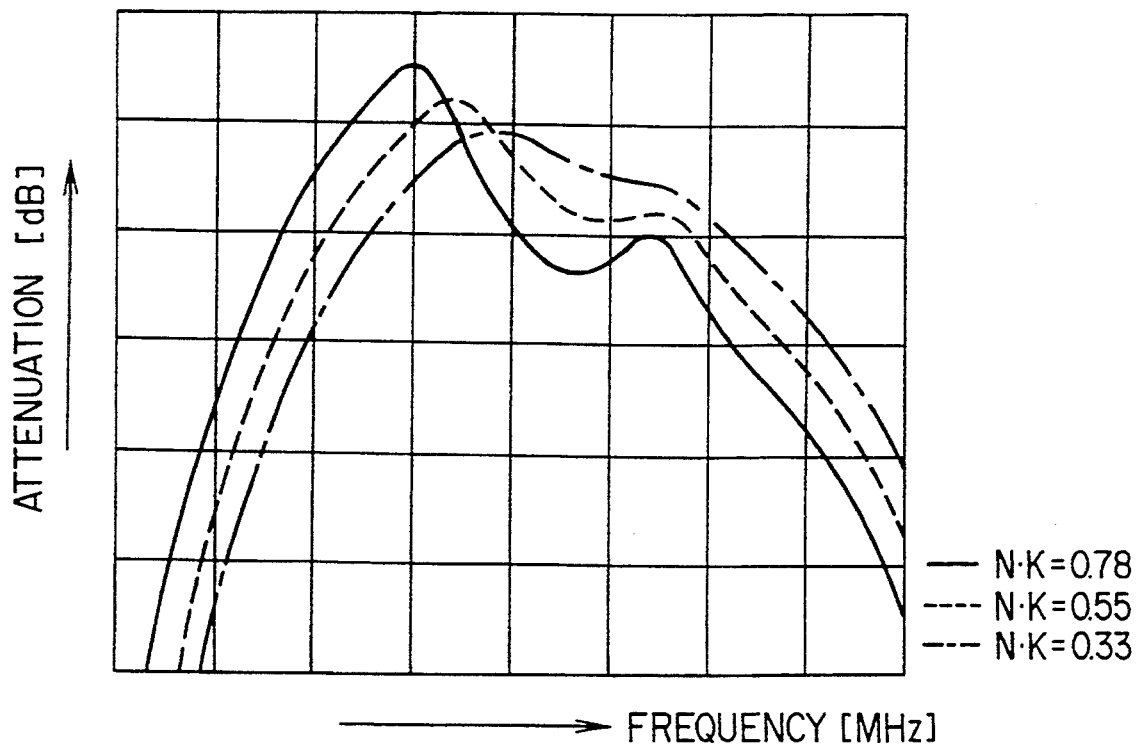
FIG. 3 shows an attenuation versus frequency characteristic of the surface acoustic wave filter illustrated in FIG. 2.

Referring to FIGS. 2 and 3, attention will be directed to a resonator type surface acoustic wave filter which does not use the grating reflector. On a piezoelectric substrate 30, input and output interdigital transducers 31 and 32 are mounted so as to oppose each other. The input interdigital transducer 31 is connected to an input terminal 33 while the output interdigital transducer 32 is connected to an output terminal 34. An input electrode pattern of the input interdigital transducer 31 is made of a metal material. Similarly, an output electrode pattern of the output interdigital transducer 32 is made of the same metal material as the input electrode pattern of the input interdigital transducer 31.

Each of the input and the output interdigital transducers 31 and 32 has a plurality of electrode digits which are equal to N in number and the metal material has a discontinuous impedance coefficient K related to acoustic impedance. The discontinuous impedance coefficient K is represented by an equation given by:

$$K = |(Zn/Zo) - 1|,$$

where Zn represents the acoustic impedance of a portion on which the electrode is mounted, Zo represents the acoustic impedance of a free surface which does not include the electrode.

In the example being illustrated, if a product of the number N and the discontinuous impedance coefficient K becomes large, impedance mismatching between the acoustic impedances Zn and Zo causes internal reflection in the input and the output interdigital transducers 31 and 32. As a result of the internal reflection, resonance phenomena occurs in the electrode digits.

In FIG. 3, a first curve shown by a chain line represents a first attenuation versus frequency characteristic when the product N·K is equal to 0.33. A second curve illustrated by a dotted line represents a second attenuation versus frequency characteristic when the product N·K is equal to 0.55. A third curve shown by a real line represents a third attenuation versus frequency characteristic when the product N·K is equal to 0.78. As apparent from the first through the third attenuation versus frequency characteristics, when the product N·K becomes large, two resonance peaks appear under the influence of the internal reflection. Under the circumstances, it will be assumed that an acoustic reflection coefficient of the electrode digits is not smaller than 0.5. Therefore, it is necessary that the product N·K is not smaller than 0.55 in order to generate the internal reflection.

Figure 4:
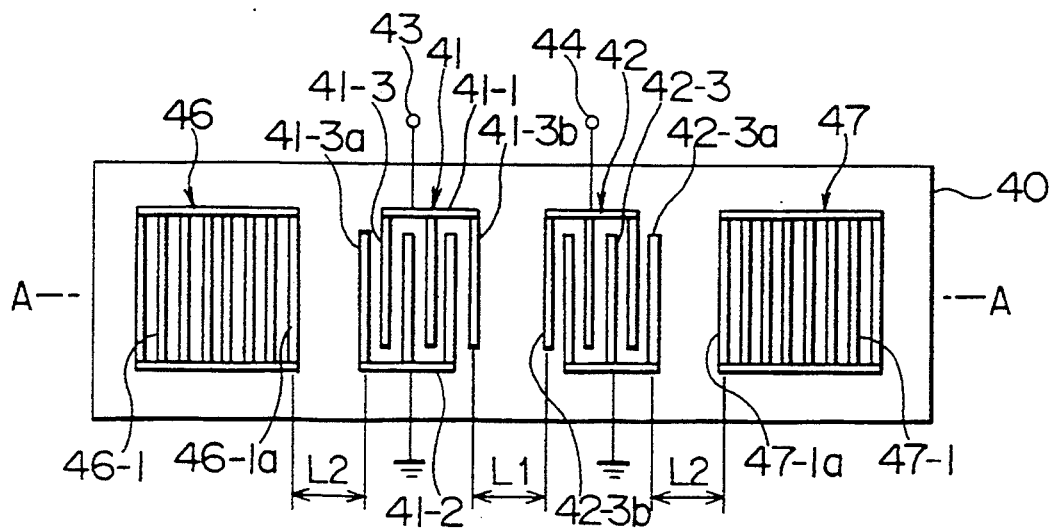
FIG. 4 shows a surface acoustic wave filter according to a preferred embodiment of this invention.
Figure 5:
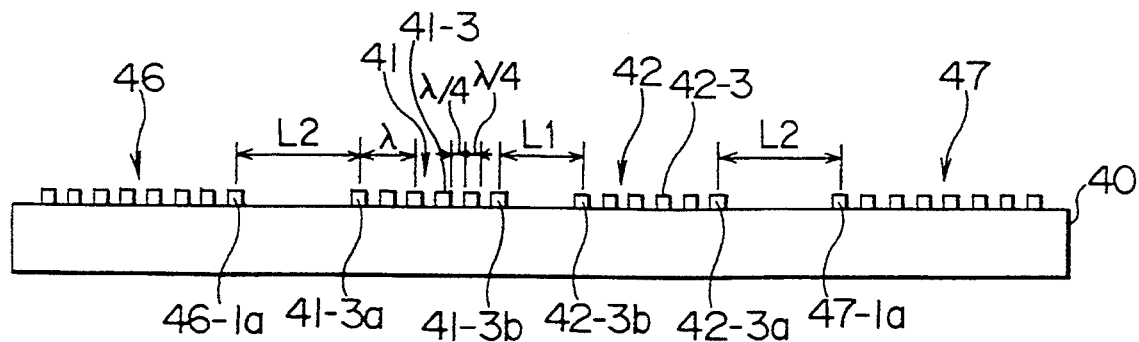
FIG. 5 is an enlarged sectional view on the plane of lines A—A of FIG. 4.

Referring to FIGS. 4 and 5, the description will proceed to a surface acoustic wave filter according to a preferred embodiment of this invention. The surface acoustic wave filter is of a multiple mode type and comprises a piezoelectric substrate 40 which is formed by the ST cut crystal substrate. Input and output interdigital transducers 41 and 42 are mounted on the piezoelectric substrate 40 such that the output interdigital transducer 42 is located opposite to the input interdigital transducer 41. First and second grating reflectors 46 and 47 are mounted on the piezoelectric substrate 40 so that the first grating reflector 46 opposes the input interdigital transducers 41 at an opposite side of the output interdigital transducer 42 and that the second grating reflector 47 opposes the output interdigital transducer 42 at an opposite side of the input interdigital transducer 41. The input and the output interdigital transducers 41 and 42 and the first and the second grating reflectors 46 and 47 are made of a metal material such as aluminum.

Taking a point described in conjunction with FIGS. 2 and 3 into consideration, the output interdigital transducer 42 is spaced apart from the input interdigital transducer 41 by a first distance L1 as will later be described in detail. The first and the second grating reflectors 46 and 47 are spaced apart from the input and the output interdigital transducers 41 and 42, respectively, by a second distance L2.

The input interdigital transducer 41 has an input electrode pattern comprising an input electrode 41-1 connected to an input terminal 43 and an input earth electrode 41-2 which is earthed. Between the input electrode 41-1 and the input earth electrode 41-2, a plurality of input electrode digits 41-3 are disposed in parallel along a predetermined direction with the input electrode digits 41-3 inter-secting one another. Each of the input electrode digits 41-3 has a predetermined width λ/4 and is formed at a predetermined interval of λ/4, where λ represents a predetermined period, and has a uniform length. The output interdigital transducer 42 has an output electrode pattern which is similar to the input electrode pattern of the input interdigital transducer 41. Namely, the output electrode pattern comprises an output electrode 42-1 connected to an output terminal 44, an output earth electrode 42-2 which is earthed, and a plurality of output electrode digits 42-3 which are disposed in parallel along the predetermined direction with the output electrode digits 42-3 inter-secting one another. Each of the output electrode digits 42-3 has the predetermined width λ/4 and is formed at the predetermined interval of λ/4 and has the uniform length. In the example being illustrated, the number N of the input electrode digits 41-3 is equal to six and is equal to the number of the output electrode digits 42-3.

The first grating reflector 46 comprises a plurality of reflector electrodes 46-1 which are disposed in parallel along the predetermined direction and which are electrically connected in parallel. Similarly, the second grating reflector 47 comprises a plurality of reflector electrodes 47-1 which are disposed in parallel along the predetermined direction and which are electrically connected in parallel.

More specifically, the first and the second distances L1 and L2 are defined as mentioned below. The input electrode pattern of the input interdigital transducer 41 includes a pair of input outermost electrode digits 41-3a and 41-3b while the output electrode pattern of the output interdigital transducer 42 includes a pair of output outermost electrode digits 42-3a and 42-3b. Each of the input and the output outermost electrode digits 41-3a, 41-3b, 42-3a, and 42-3b has a center line extending along a longitudinal direction thereof. As illustrated in FIG. 5 in detail, the first distance L1 is equal to an interval between the center line of the input outermost electrode digit 41-3b and the center line of the output outermost electrode digit 42-3b. On the other hand, the first and the second grating reflectors 46 and 47 include first and second outermost electrodes 46-1a and 47-1a which are close to the input and the output outermost electrode digits 41-3a and 42-3a, respectively. Each of the first and the second outermost electrodes 46-1a and 47-1a has a center line extending along a longitudinal direction thereof. The second distance L2 is equal to an interval between the center line of the first outermost electrode 46-1a and the center line of the input outermost electrode digit 41-3a and is equal to an interval between the center line of the second outermost electrode 47-1a and the center line of the output outermost electrode digit 42-3a. As shown in FIG. 5, the predetermined electrode period $\lambda$ is equal to twice an interval between two center lines of the two nearest electrode digits.

The input interdigital transducer 41 is supplied with an input electric signal through the input terminal 43 and converts the input electric signal into an input surface acoustic wave. The input surface acoustic wave is propagated on a surface of the piezoelectric substrate 40 as a propagated surface acoustic wave along the predetermined direction. The propagated surface acoustic wave is received by the output interdigital transducer 42 as a received surface acoustic wave. The output interdigital transducer 42 converts the received surface acoustic wave into an output electric signal. The output interdigital transducer 42 outputs the output electric signal through the output terminal 44.

In the surface acoustic wave filter illustrated in FIG. 4, if the product N·K mentioned in conjunction with FIG. 2 is not smaller than 0.55, first through third longitudinal modes are excited. The first longitudinal mode is based on a first resonance Ra occurring between the input and the output interdigital transducers 41 and 42 within a stop band defined by the input and the output interdigital transducers 41 and 42. The second longitudinal mode is based on a second resonance Rb occurring in the input interdigital transducer 41 or the output interdigital transducer 42 caused by the internal reflection in the electrode digits. The third longitudinal mode is based on a third resonance Rc occurring between the first and the second grating reflectors 46 and 47 out of the stop band. The first through the third resonances Ra, Rb, and Rc have first through third resonance frequencies, respectively. The surface acoustic wave filter utilizing the first through the third longitudinal modes may be called a triple mode type surface acoustic wave filter.

Figure 6:
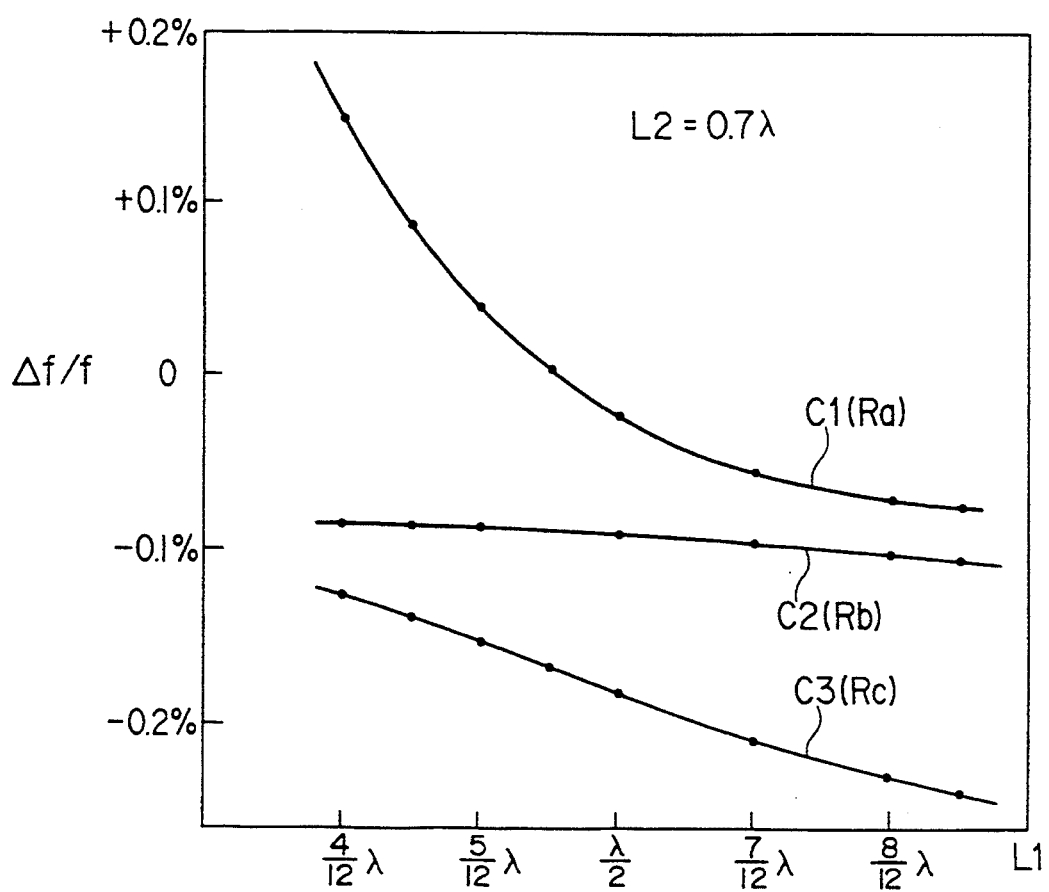
FIG. 6 shows a first frequency characteristic of the surface acoustic wave filter illustrated in FIG. 4.

Referring to FIG. 6, first through third curves C1, C2, and C3 correspond to the first through the third resonances Ra, Rb, and Rc, respectively, and represent first through third frequency fluctuation coefficients of the first through the third resonance frequencies, respectively. In this case, the second distance L2 is set at 0.7$\lambda$. Each of the first and the third frequency fluctuation coefficients varies dependent upon the first distance L1. In particular, when the first distance L1 is reduced, a difference between the first and the second frequency fluctuation coefficients becomes large. Similarly, if the first distance L1 is increased, a difference between the second and the third frequency fluctuation coefficients becomes large. This means that the triple mode type surface acoustic wave filter requires a restricted range with respect to the first distance L1.

Figure 7:
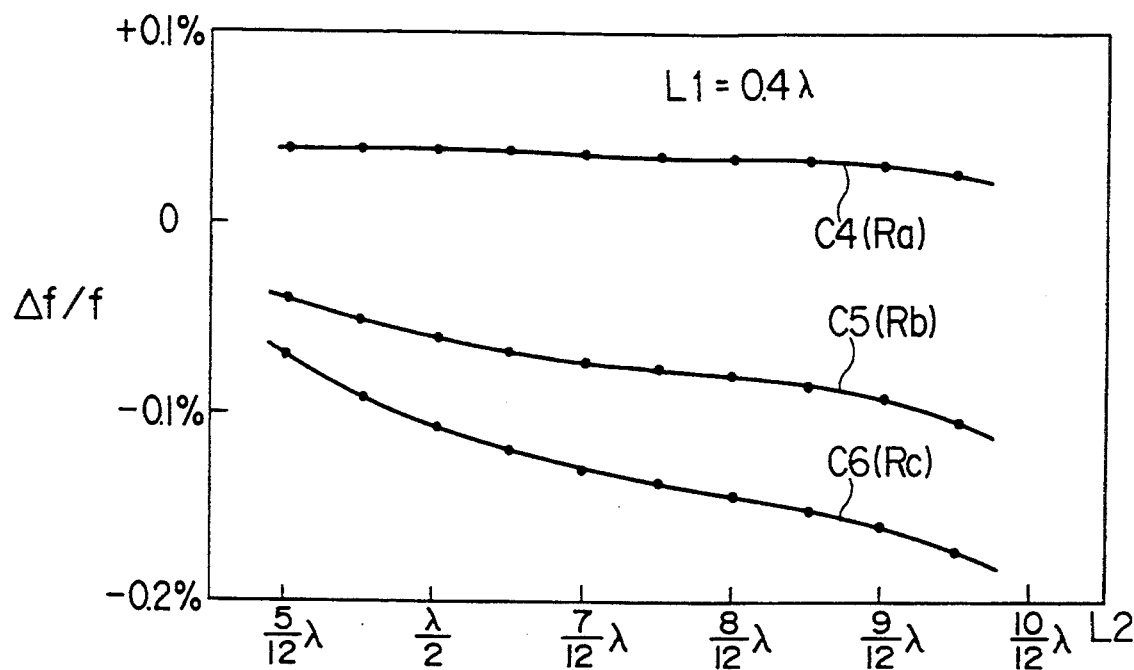
FIG. 7 shows a second frequency characteristic of the surface acoustic wave filter illustrated in FIG. 4.

Referring to FIG. 7, fourth through sixth curves C4, C5, and C6 correspond to the first through the third resonances Ra, Rb, and Rc, respectively, and represent first through third frequency fluctuation coefficients of the first through the third resonance frequencies, respectively. In this event, the first distance L1 is set at 0.4$\lambda$. In FIG. 7, each of the first through the third frequency fluctuation coefficients has a small variation and is slightly influenced by the second distance L2. With respect to the second distance L2, the triple mode type curface acoustic wave filter may have a range wider than the restricted range of the first distance L1.

Under first and second conditions described hereinunder, it is possible to provide the triple mode type surface acoustic wave filter by utilizing the first through the third longitudinal modes which are related to the first through the third resonances Ra, Rb, and Rc and which are different from one another. The first condition is defined by a first inequality given by:

$$(n/2-4/24)\lambda \leq L1 \leq (n/2-2/24)\lambda,$$

where n represents a positive integer. The second condition is defined by a second inequality given by:

$$(n/2-2/24)\lambda \leq L2 \leq (n/2+7/24)\lambda.$$

Figure 8:
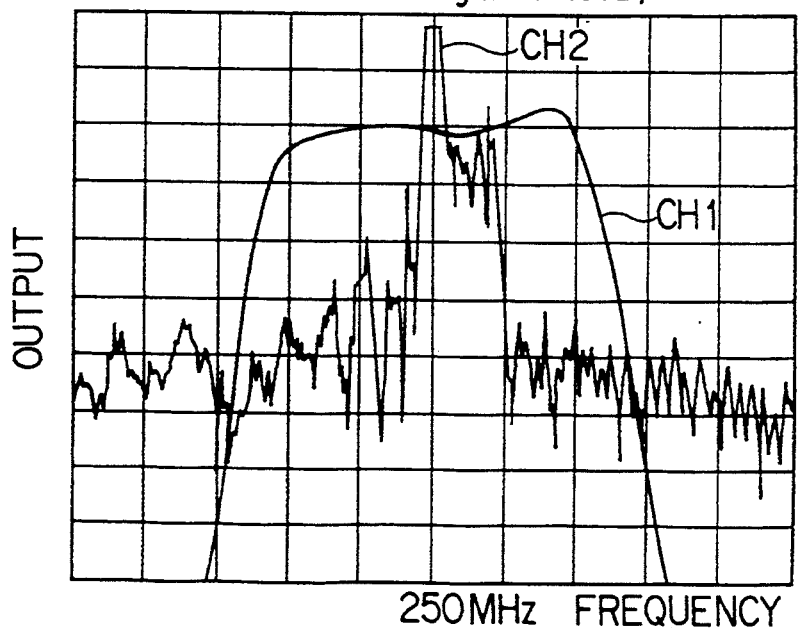
FIG. 8 shows a first output versus frequency characteristic of the surface acoustic wave filter illustrated in FIG. 4.

Such a triple mode type surface acoustic wave filter has an output versus frequency characteristic as shown in FIG. 8. In FIG. 8, a center frequency of the stop band is equal to 250 MHz. A channel CH1 shows an enlarged part in the neighborhood of the stop band of a channel CH2.

Under a third condition described hereinunder, it is possible to provide a double mode type surface acoustic wave filter by utilizing two longitudinal modes which are related to the first and the second resonances Ra and Rb and which are different from each other. The third condition is defined by a third inequality given by:

$$(n/2-1/24)\lambda \leq L1 \leq (n/2+7/24)\lambda.$$

Figure 9:
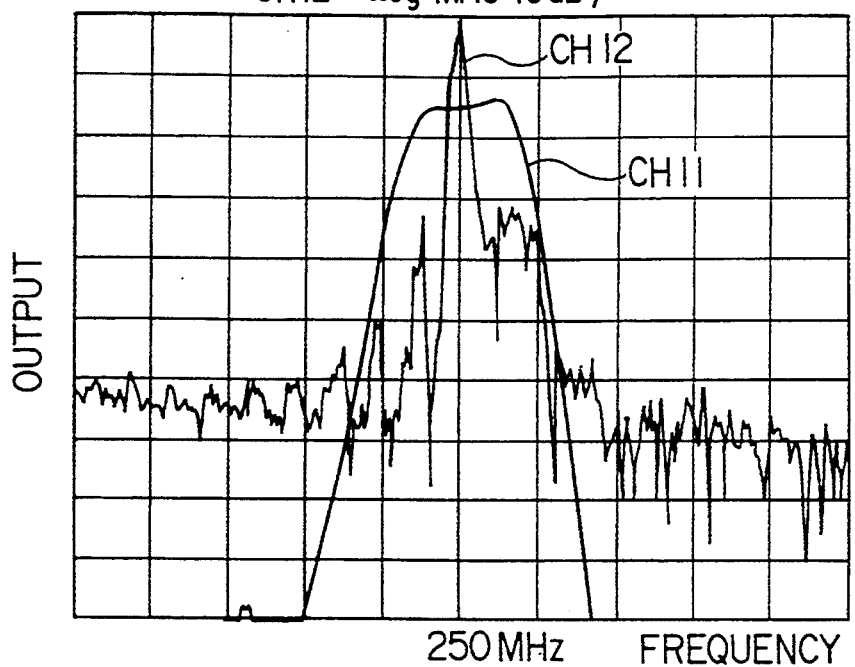
FIG. 9 shows a second output versus frequency characteristic of the surface acoustic wave filter illustrated in FIG. 4.

Such a double mode type surface acoustic wave filter has an output versus frequency characteristic as shown in FIG. 9. Like in FIG. 8, a center frequency of the stop band is equal to 250 MHz. A channel CH11 shows an enlarged part in the neighborhood of the stop band of a channel CH12.

As apparent from the above description, the present invention is characterized by the product N·K, the first distance L1 between the input and the output interdigital transducers 41 and 42, and the second distance L2 between the input interdigital transducer 41 and the first grating reflector 46 and between the output interdigital transducer 42 and the second grating reflector 47.

While this invention has thus far been described in conjunction with a preferred embodiment thereof, it will readily be possible for those skilled in the art to put this invention into practice in various other manners.

What is claimed is:

1. A surface acoustic wave filter utilizing at least two longitudinal modes which are different from each other, the wave filter comprising:

a piezoelectric substrate;

an input interdigital transducer being supplied with an input electric signal and mounted on said piezoelectric substrate for converting said input electric signal into an input surface acoustic wave as a surface acoustic wave propagated thereon, said input interdigital transducer comprising a plurality of input electrode digits which intersect one another and which are equal to N in number where N represents a positive integer greater than two;

an output interdigital transducer mounted on said piezoelectric substrate and opposed to said input interdigital transducer and comprising a plurality of output electrode digits which are equal to N in number and which intersect one another, said output interdigital transducer receiving said propagated surface acoustic wave as a received surface acoustic wave and converting said received surface acoustic wave into an output electric signal;

a first grating reflector mounted on said piezoelectric substrate and opposed to said input interdigital transducer at an opposite side of said output interdigital transducer; and a second grating reflector mounted on said piezoelectric substrate and opposed to said output interdigital transducer at an opposite side of said input interdigital transducer;

each of said input and said output electrode digits being made of a metal material having a discontinuous impedance coefficient K related to acoustic impedance, said filter being structured so that a product of said number N and said discontinuous impedance coefficient K is not smaller than 0.55, each of said input and said output interdigital transducers having a predetermined electrode period $\lambda$, said output interdigital transducer being spaced apart from said input interdigital transducer by a first distance L1, said first and said second grating reflectors being spaced apart from said input and said output interdigital transducers, respectively, by a second distance L2, said first distance L1 being defined by an inequality given by:

$$(n/2-4/24)\lambda \leq L1 \leq (n/2-2/24)\lambda,$$

where n represents a positive integer, said second distance L2 being defined by an inequality given by:

$$(n/2-2/24)\lambda \leq L2 \leq (n/2+7/24)\lambda.$$

2. A surface acoustic wave filter utilizing at least two longitudinal modes which are different from each other, the wave filter comprising:

a piezoelectric substrate;

an input interdigital transducer being supplied with an input electric signal and mounted on said piezoelectric substrate for converting said input electric signal into an input surface acoustic wave as a surface acoustic wave propagated thereon, said input interdigital transducer comprising a plurality of input electrode digits which intersect one another and which are equal to N in number where N represents a positive integer greater than two;

an output interdigital transducer mounted on said piezoelectric substrate and opposed to said input interdigital transducer and comprising a plurality of output electrode digits which are equal to N in number and which intersect one another, said output interdigital transducer receiving said propagated surface acoustic wave as a received surface acoustic wave and converting said received surface acoustic wave into an output electric signal;

a first grating reflector mounted on said piezoelectric substrate and opposed to said input interdigital transducer at an opposite side of said output interdigital transducer; and a second grating reflector mounted on said piezoelectric substrate and opposed to said output interdigital transducer at an opposite side of said input interdigital transducer;

each of said input and said output electrode digits being made of a metal material having a discontinuous impedance coefficient K related to acoustic impedance, said filter being structured so that a product of said number N and said discontinuous impedance coefficient K is not smaller than 0.55, each of said input and said output interdigital transducers having a predetermined electrode period $\lambda$, said output interdigital transducer being spaced apart from said input interdigital transducer by a first distance L1, said first distance L1 being substantially defined by an inequality given by:

$$(n/2-1/24)\lambda \leq L1 \leq (n/2+6/24)\lambda.$$

where n represents a positive integer.

* * * * *